United States Patent [19]

Kawaguchi et al.

[11] Patent Number: 4,568,592
[45] Date of Patent: Feb. 4, 1986

[54] ANISOTROPICALLY ELECTROCONDUCTIVE FILM ADHESIVE

[75] Inventors: Toshiyuki Kawaguchi, Ageo; Hideki Suzuki, Omiya, both of Japan

[73] Assignee: Shin-Etsu Polymer Co., Ltd., Tokyo, Japan

[21] Appl. No.: 722,343

[22] Filed: Apr. 12, 1985

Related U.S. Application Data

[63] Continuation-in-part of Ser. No. 537,578, Sep. 30, 1983.

[30] Foreign Application Priority Data

Oct. 5, 1982 [JP] Japan ................ 57-175169

[51] Int. Cl.⁴ ............ B32B 5/16; B32B 5/28; H01B 1/06
[52] U.S. Cl. ................ 428/107; 252/511; 252/512; 252/514; 252/515; 252/520; 428/112; 428/113; 428/294; 428/295; 428/302; 428/303; 428/338; 428/339; 428/903
[58] Field of Search ............ 428/107, 112, 113, 294, 428/295, 302, 303, 338, 339, 903; 252/515, 514, 520, 511, 512

[56] References Cited

U.S. PATENT DOCUMENTS

| | | | |
|---|---|---|---|
| 4,042,534 | 8/1977 | Andrianov et al. | 252/511 |
| 4,098,945 | 7/1978 | Oehmke | 252/514 |
| 4,113,981 | 9/1978 | Fujita et al. | 252/511 |
| 4,127,699 | 11/1978 | Aumiller et al. | 252/511 |
| 4,145,317 | 3/1979 | Sado et al. | 252/511 |
| 4,157,932 | 6/1979 | Hirata | 252/514 |
| 4,170,677 | 10/1979 | Hutcheson | 428/119 |
| 4,199,637 | 4/1980 | Sado | 428/303 |
| 4,228,194 | 10/1980 | Meeder | 428/303 |
| 4,496,475 | 1/1985 | Abrams | 252/512 |
| 4,500,595 | 2/1985 | Gerteisen et al. | 428/295 |

Primary Examiner—James C. Cannon
Attorney, Agent, or Firm—Hopgood, Calimafde, Kalil, Blaustein & Judlowe

[57] ABSTRACT

A film adhesive of a thermoplastic or thermosetting polymeric insulative material can be imparted with anisotropic electroconductivity by dispersing electroconductive fibrils of specified dimensions therein in orientation each lying within a plane substantially parallel to the surface of the film adhesive. The film adhesive is useful in adhesively bonding two circuit boards each having a plurality of electric terminals to be electrically connected each on one circuit board to the oppositely positioned terminal on the other circuit board. The orientation of the fibrils in a plane parallel to the surface of the film adhesive may be either unidirectional or at random.

8 Claims, 4 Drawing Figures

ANISOTROPICALLY ELECTROCONDUCTIVE FILM ADHESIVE

BACKGROUND OF THE INVENTION

This is a continuation-in-part application from a copending U.S. patent application Ser. No. 537,578 filed Sept. 30, 1983.

The present invention relates to an anisotropically electroconductive film adhesive suitable for adhesively bonding two electric terminals or, more particularly, to a film adhesive suitable for adhesively bonding two electric terminals under heating and pressure so as to give good electroconductivity between the terminals, i.e. in the direction perpendicular to the plane of the film, but highly insulating within the plane of the film.

A heat-bondable, anisotropically electroconductive adhesive is known. For example, Japanese Pat. Kokai 51-114439 and 56-122193 teach an adhesive based on an insulating resinous adhesive such as epoxy and silicone resins as the matrix with oriented dispersion of a small amount of an electroconductive particles therein. Such an adhesive is, however, flowable at room temperature so that the adhesive must be used by applying to and drying on the surface of the bodies to be adhesively bonded. A problem in the adhesive of such a type is that the conductive particles may settle in the matrix resin during storage to greatly decrease the anisotropy in the electroconductivity resulting in eventual short-circuiting or poor insulation between adjacent electric terminals. When the surface of a bonded body is coated in advance with such an adhesive followed by drying, the layer of the adhesive is sometimes subject to damage during handling before bonding in addition to the disadvantages of the increased intermediate products.

While it is a desirable condition in the use of the anisotropically conductive adhesive that the thickness of the adhesive layer is sufficiently small to be in the same order as the diameter of the dispersed conductive particles in order to give good anisotropy in the conductivity, i.e. with good conductivity between the bonded terminals on the opposite sides of the adhesive layer but good insulation between adjacent terminals, because the orientation of the conductive particles is sometimes disturbed in a relatively thick layer of the adhesive to decrease the insulation between the adjacent terminals. Such a small thickness of the adhesive layer is of course effective to have substantially no chain-like linkage of the conductive particles contributing to the improvement of the anisotropy of the conductivity but naturally disadvantageous due to the poor strength of the adhesive bonding to cause peeling.

On the other hand, a pre-shaped film adhesive is known, which is in the solid form of an unsupported film or sheet made of a hot-melt type or heat-curable resin and used by sandwiching between two bodies to be bonded and the bodies are adhesively bonded by heating under pressure. Film adhesives are widely used owing to the good workability and handiness in the adhesive bonding works by virtue of the omission of the troublesome steps of coating and drying of a flowable adhesive. An electroconductive film adhesive can of course be prepared by dispersing conductive particles in the matrix resin although no anisotropically electroconductive film adhesive is known.

SUMMARY OF THE INVENTION

It is therefore an object of the present invention to provide an anisotropically electroconductive film adhesive structure usable by heating under pressure as sandwiched between the bodies, e.g. electric terminals on two opposite circuit boards, to be bonded with conductivity therebetween but without destroying the insulation between the adjacent bodies, e.g. the terminals on the same circuit board. That is, the inventive film adhesive is conductive in the direction of the thickness but insulating within the plane of the film when two bodies are adhesively bonded together with the film adhesive sandwiched therebetween.

Thus, the anisotropically electroconductive film adhesive structure of the present invention comprises (a) a film-like body of a thermally adhesive insulative material as a matrix and (b) electroconductive fibrils disposed in said matrix each having a length of 300 μm or smaller with an aspect ratio of at least 3 and dispersed in the film-like body of said insulative material oriented within a plane substantially parallel to the surface of the film-like insulative material, the diameter of the fibrils being equal to or smaller than a half of the thickness of the film-like insulative material and the volume ratio of the fibrils to the film-like body of the matrix being in the range from 2 to 20%.

DETAILED DESCRIPTION OF THE PREFERRED EMBODIMENTS

Figure 1:
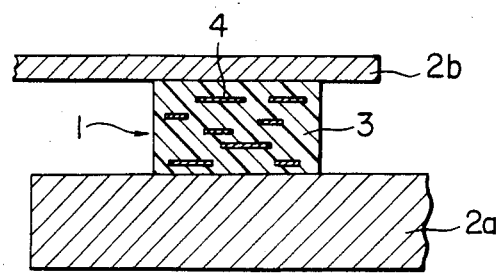
FIGS. 1 and 2 are each a schematic cross sectional illustration of the inventive film adhesive structure sandwiched between two circuit boards before heating under pressure and after bonding of the circuit boards by heating under pressure, respectively.

As is mentioned above, the inventive film adhesive structure comprises a film-like base body of a thermally adhesive insulative resin or polymeric material as a matrix and a large number of electroconductive fibrils dispersed in the film-like base body as the matrix each in an oriented disposition.

The here described thermally adhesive insulative resin includes both the thermoplastic resins and the thermosetting resins provided that the resin is deformable or flowable when heated at an elevated temperature and capable of exhibiting adhesion by curing at the high temperature or by solidifying with cooling. So-called hot-melt type adhesive resins and certain kinds of synthetic rubbers are also suitable for this purpose. The thermoplastic resins are advantageous because the heating temperature may be relatively low and adhesive bonding can be obtained by merely cooling the once heated and melted resin to room temperature so that the working efficiency therewith is relatively high in comparison with the thermosetting resins. The strength of the adhesive bonding obtained with the thermoplastic resins, however, is not so high with poor heat resistance. On the other hand, the thermosetting resins are preferred when highly strong adhesive bonding is desired although the working efficiency therewith is low due to the high curing temperature and the relatively low velocity of curing in general, which can be improved only by the sacrifice of the storable life, for example, by the use of an increased amount of the curing catalyst.

Suitable thermoplastic resins are exemplified by polyamide resins, polyester resins, ionomers, polyolefins, several types of acrylic polymers and the like, and certain types of synthetic rubbers as well as modified or composite materials thereof. Suitable thermosetting resins are exemplified by epoxy resins, urethane resins, acrylic resins, silicone resins and certain types of synthetic rubbers, e.g. chloroprene rubbers, nitrile rubbers and the like. These resins or rubbers may be admixed with curing or vulcanizing agents, controlling agents, aging retarders, heat-resistance improvers, heat-conductivity improvers, stickiness improvers, softening agents, coloring agents and the like according to need.

Of course, any insulative material with a high enough dielectric constant and suitable adhesive properties could be used to form a film which holds the conductive fibrils in accordance with the instant invention. For instance, copolymers of ethylene such as copolymers of ethylene and vinyl acetate; ethylene-vinyl acetate copolymers modified by at least partial saponification of the vinyl acetate moieties or by graft copolymerization onto acetoxy, hydroxy or carbonyl bonyl groups; copolymers of ethylene and an alkyl acrylate and copolymers of ethylene and ionomer resins are all suitable materials for the insulative film. Moreover, a plethora of other specific materials may be used, such as resins of nylon, saturated polyester, butyral, polymethyl methacrylate, polyurethane, polycarbonate, or thermoplastic styrenebutadiene rubbers.

The electroconductive fibrils or very small fibers include a variety of very thin fibrous materials having electroconductivity without particular limitations. Typical conductive fibers are wires and whiskers of metals and conductive ceramics such as stainless steels, aluminum, copper, tungsten, molybdenum, lead, magnesium, bronze, brass, titanium nitride, boron nitride and the like prepared in a variety of known methods and carbon fibers prepared by the infusibilization and carbonization of organic fibers of, for example, rayon, polyacrylonitrile and bituminous materials. Fibrils of an insulative material such as glass may be converted to electroconductive by plating with a metal and such metal-plated fibrils may be used. In particular, plating with gold or anticorrosion treatment on the above mentioned metal fibrils is effective in increasing the stability against the influences of the environment such as rusting caused by the atmospheric moisture or oxidizing materials.

The electroconductive fibrils should each have a length of not exceeding 300 $\mu$m or, preferably, not exceeding 200 $\mu$m or, more preferably, in the range from 15 to 60 $\mu$m with an aspect ratio, i.e. the ratio of the length to the diameter, of at least 3. The fibrils should have a diameter in the range from 5 to 100 $\mu$m. When the length of the fibrils is larger than 300 $\mu$m, the insulation within the plane of the film adhesive structure may sometimes be decreased, especially, when the distribution of the terminals on the circuit boards to be bonded is very dense as is sometimes the case in the recent electronic devices due to the poor alignment of the fibrils in the film adhesive structure.

The inventive film adhesive is prepared by dispersing the conductive fibrils in the matrix of the thermally adhesive polymeric material in an oriented disposition each substantially within a plane parallel to the surface of the film. The orientation of the conductive fibrils within a plane parallel to the surface of the film further includes two cases that all of the fibrils run unidirectionally in parallel with each other, i.e. in one and the same direction, and the conductive fibrils lie at random within the plane. These two types of fibril orientation have their own advantages and disadvantages as explained below.

When the fibril dispersion of the unidirectional orientation is desired, the conductive fibrils are uniformly dispersed in the matrix of the thermally adhesive polymeric material followed by shaping of the mixture into a film-like form under a unidirectional shearing force such as in extrusion molding so that the conductive fibrils are oriented in the direction of extrusion and parallel to the surface of the film. When the random orientation of the conductive fibrils within the plane parallel to the surface of the film is desired, on the other hand, the extrusion molding or the like shaping method under a unidirectional shearing force cannot be used. A convenient method in this case is the utilization of the techniques of screen printing with a uniform mixture of the thermally adhesive polymeric material in a printable consistency and the conductive fibrils on a releasing paper followed by solidification of the mixture into a solid film which is then peeled off the releasing paper.

The unidirectional orientation of the conductive fibrils within a plane parallel to the surface of the film is preferred when the thickness of the film adhesive is relatively small due to the better insulation in the direction perpendicular to the direction of orientation of the fibrils along the surface of the film adhesive structure although a larger force is required in adhesively bonding two terminals under pressure because the electric conduction between adjacent fibrils depends solely on the tangential contact therebetween. On the other hand, the random orientation of the conductive fibrils within the plane parallel to the surface of the film is preferable when a relatively large thickness of the film adhesive is desired to obtain a larger strength of adhesive bonding and good electric conduction under a relatively small pressure for adhesive bonding with the film adhesive. Alternatively, the inventive film adhesive may have a laminar structure composed of several of layers, in one of which the conductive fibrils are oriented unidirectionally but in a direction perpendicular to or making an angle of at least 30° or, preferably, at least 60° with the direction of fibril orientation in the neighboring layers. The angle here described is an angle made by the projections of two fibrils in two different layers on the surface of the film. Such a laminar structure of the film adhesive can be obtained by laminating a plurality of single films each having the conductive fibrils dispersed in a unidirectional orientation in such a manner that the direction of the fibril orientation is alternated from one layer to the next. At any rate, the overall thickness of the inventive film adhesive should be in the range of 10 to 200 $\mu$m or, preferably, from 10 to 100 $\mu$m or, more preferably, from 10 to 70 $\mu$m because the strength of adhesive bonding may be insufficient with a film adhesive having a thickness smaller than 10 m while an excessively large thickness of the film adhesive does not contribute to the increase in the strength of adhesive bonding rather with a disadvantage of decreased or unstable electric conduction between the terminals bonded by use of the film adhesive as is understood from the explanation given below for the mechanism of the anisotropic electric conduction obtained with the inventive film adhesive structure. It is optional that one or both of the inventive film adhesive are provided with a coating layer of a sticking agent in order to improve the initial adhesion or initial bonding strength. It is of course desirable that such a layer of the sticking agent is also impregnated with conductive fibrils oriented in parallel with the surface of the film adhesive.

Suggested applications of the anisotropically electroconductive film adhesive of the present invention include electric connection with simultaneous adhesive bonding of two flexible or rigid circuit boards with terminals formed of a foil of a metal such as copper, aluminum and the like or formed by printing with a electroconductive paint or ink on a substrate of polyimide resin, polyethylene terephthalate and the like, circuit boards with terminals formed of a conductive oxide film such as indium oxide on a glass-made substrate and other electronic devices such as LSIs, solar cells, resistors and others without particular limitations although it is preferable from the standpoint of working efficiency that the material of the substrate has a good heat conductivity or may be heated in advance.

In the following, the inventive film adhesive and the manner of use thereof are described with reference to the accompanying drawing.

FIG. 1 illustrates a cross sectional view of the inventive film adhesive 1 sandwiched between two circuit boards 2a, 2b having terminals (not shown in the figure) thereon before applying heat and pressure. The film adhesive 1 is formed of a thermally adhesive polymeric material 3, which is of course electrically insulative, forming a matrix in a film-like form and a large number of conductive fibrils 4 dispersed in the matrix of the polymeric material 3. Each of the conductive fibrils 4 lies within a plane substantially parallel to the surface of the film adhesive 1. In this state, no electric conduction can be obtained between the terminals on the circuit boards 2a, 2b since the conductive fibrils 4 are isolated from each other and the terminals are also not in contact with the conductive fibrils with the insulative polymeric material 3 intervening therebetween.

Figure 2:
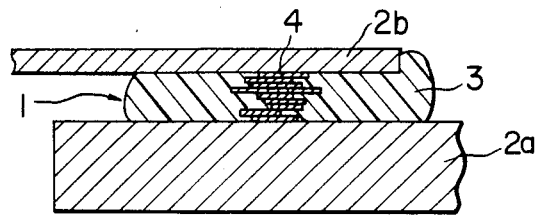

FIG. 2 illustrates the cross section of the same assembly of the film adhesive 1 and the circuit boards 2a, 2b as in FIG. 1 but after application of heat and pressure to effect adhesive bonding of the circuit boards 2a, 2b with electric conduction established between the terminals. When heat is applied and the temperature of the film adhesive 1 is increased, the thermally adhesive polymeric insulative material 3 is first softened and, under simultaneous application of a pressure between the circuit boards 2a, 2b, a portion of the thus softened polymeric material 3 is squeezed out of the initial space between the circuit boards 2a, 2b while the conductive fibrils 4 agglomerate to form an aggregate to contribute to the electric conduction between the terminals on the circuit boards 2a, 2b. When the thermally adhesive polymeric material is thermosetting, the circuit boards 2a, 2b are kept for a while in this state of the elevated temperature under pressure so that the curing reaction of the thermosetting polymer 3 proceeds to such an extent that the terminals have been firmly bonded adhesively and release of the pressure no longer affects the electric conduction between the terminals with the conductive fibrils 4 fixed in the thus cured polymeric matrix 3. When the thermally adhesive polymeric material 3 is thermoplastic or hot-melting, the temperature of the assembly of the circuit boards 2a, 2b and the film adhesive 1 therebetween is decreased with the pressure applied as such down to a temperature at which the thermoplastic polymer 3 is no longer plastic or flowable and the terminals are bonded adhesively followed by release of the pressure which also does not affect the electric conduction between the terminals with the conductive fibrils 4 fixed in the matrix of the solidified polymeric material 3. It is readily understood that a too large thickness of the film adhesive 1 is of no advantages with an increased volume of the softened polymeric material 3 to be squeezed out.

Figure 3:
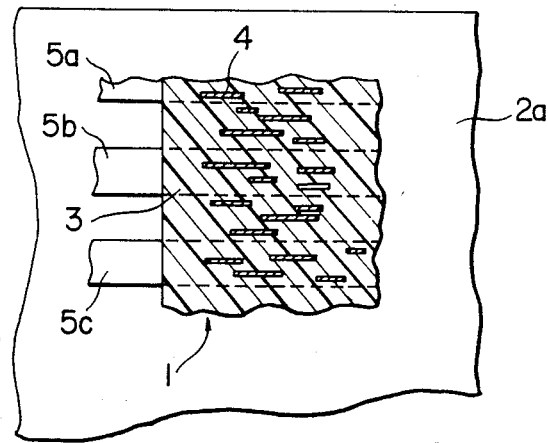
FIG. 3 is a plan view of the inventive film adhesive structure placed on an array of electric terminals.

FIG. 3 is a plan view of the inventive film adhesive 1 in which the conductive fibrils 4 are unidirectionally oriented in the matrix of the thermally adhesive polymeric material 3 each within a plane parallel to the surface of the film adhesive 1 mounted on a circuit board 2a having a set of terminals 5a, 5b, 5c . . . . arranged in a stripe-wise manner. In such an arrangement of the terminals 5a, 5b, . . . , it is advantageous that the film adhesive 1 is placed on the circuit board 2a in such a manner that each of the conductive fibrils 4 runs in parallel to the longitudinal direction of the striped terminals 5a, 5b, . . . . so that the electrical insulation between adjacent terminals, e.g. 5a and 5b, 5b and 5c, etc., can be kept high.

Figure 4:
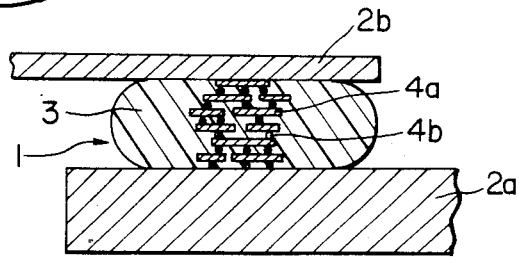
FIG. 4 is a schematic cross sectional illustration of an inventive film adhesive having several layers of the conductive fibrils, the orientation of the fibrils in a layer being perpendicular to that in the neighboring layer, sandwiched between two circuit boards after bonding by heating under pressure.

FIG. 4 illustrates a cross sectional view of the inventive film adhesive 1 having a laminar structure after application of heat and pressure as sandwiched between two circuit boards 2a, 2b. As is illustrated in the figure, the film adhesive 1 has a laminar structure composed of several layers, in each of which the conductive fibrils 4a or 4b are unidirectionally oriented in the thermally adhesive polymeric material 3 forming a layer parallel to the surface of the film adhesive 1 in a direction perpendicular to the running direction of the fibrils 4b or 4a in the neighboring layers. In this case, the electric connection between two fibrils 4a, 4b is obtained by the contacting between two perpendicularly intersecting generating lines on the neighboring fibrils 4a, 4b assuming a cylindrical form for each of the fibrils so that good electric conduction can be ensured even under a relatively small pressure.

Following are the examples to illustrate the anisotropically electroconductive film adhesive of the present invention in more detail.

EXAMPLE 1

A mixture was prepared by uniformly blending in a kneader 100 parts by weight of an epoxy resin (Epikote 1001, a product by Shell International Chemicals Corp.), 26 parts by weight of a liquid polybutadiene (Polybd R-45EPI, a product by Idemitsu Petrochemicals Co.), 14 parts by weight of an epoxidated soybean oil, 6 parts by weight of a fumed silica filler (Aerosil 300, a product by Nippon Aerosil Co.) and 6 parts by weight of dicyandiamide as a curing agent of the epoxy resin together with fibrils of brass having an average diameter of about 50 μm and an overall length of 150 μm in an amount of 10% by volume based on the total volume of the other components and the mixture was shaped into a form of a film having a thickness of 70 μm by use of a roll coater followed by heating in a hot air oven at 110° C. for 10 minutes into a semi-cured state. The brass fibrils in the thus obtained film adhesive were oriented each in parallel with the surface of the film and also unidirectionally within the plane in the direction of the roll coating.

In the next place, the film adhesive was sandwiched between the terminal portions of two circuit boards on which the gold-plated contacting terminals were disposed on a substrate of a polyimide resin in a stripe-wise manner, each of the stripes having a width of 1 mm and the pitch of the stripes being 2.54 mm, in such a manner that each of the terminals on one circuit board was at a position exactly opposite to one of the terminals on the other circuit board and heated and pressed externally at 170° C. under a pressure of 5 kg/cm$^2$ for 480 seconds so that the epoxy resin was completely cured to firmly bond the circuit boards. The electric resistance between the oppositely positioned terminals on the upper and lower circuit boards was 33 m.ohm per 30 mm length of the terminals while the resistance between the adjacent terminals on the same circuit board was at least 2000 M.ohm as measured with application of a voltage of 500 volts D.C. The adhesive bonding between the circuit boards through the film adhesive therebetween was so firm that they can be pulled apart only by the destruction in the polyimide substrate plates.

EXAMPLE 2

A mixture was prepared by uniformly blending 100 parts by weight of a polyolefin resin (MODIC E-100H, a product by Mitsubishi Petrochemicals Co.), 10 parts by weight of a butyral resin (Esrec B BM-1, a product by Sekisui Chemical Co.) and 3 parts by weight of linseed oil together with fibrils of carbon fibers having a diameter of 7 $\mu$m and a length of 60 $\mu$m in an amount of 12% by volume based on the total volume of the other components and the mixture was shaped by use of a gravure roller into a film having a thickness of 20 $\mu$m, in which the carbon fibrils were unidirectionally oriented in parallel to the surface of the film.

Five sheets of the thus prepared film adhesive with unidirectionally distributed carbon fibrils were stacked one on the other in such a manner that the running direction of the carbon fibrils in one sheet was perpendicularly alternated relative to that in the neighboring sheets and the film stack was pressed with heating to be integrated into a sheet of 100 $\mu$m thickness.

The laminated film adhesive thus obtained was coated on one surface with an acrylic sticking agent and placed on and temporarily fixed at the surface coated with the sticking agent to a printed circuit board of a polyester resin substrate provided with stripe-wise terminals each having a width of 0.8 mm and being disposed at a pitch of 1.6 mm as formed by printing with a carbon-filled electroconductive paint. Further, a glass-substrate circuit board provided with stripe-wise terminals in the same disposition and pitch as above formed by the vapor deposition of indium oxide was placed thereon to sandwich the film adhesive with the polyester-based circuit board in the same manner as in Example 1 followed by pressing under a pressure of 10 kg/cm$^2$ with heating at 110° C. for 20 seconds and cooling as kept under pressure so that the polyester-based and glass-based circuit boards were found to have been firmly bonded together adhesively through the film adhesive. The electric resistance between the oppositely facing terminals on the two circuit boards was 3.8 k.ohm/20 mm on an average while the resistance between the terminals on the same circuit board was at least 20 M.ohm.

EXAMPLE 3

A rubber dispersion was prepared by dissolving or dispersing 100 parts by weight of a chloroprene rubber (Denkachloroprene A-400, a product by Denki Kagaku Kogyo Co.), 40 parts by weight of a stickiness improver (SP 559, a product by Schenectady Chemicals Co.), 20 parts by weight of an aging retarder (Antage BHT, a product by Kawaguchi Chemicals Co.) and 5 parts by weight of a titanium dioxide pigment in a 1:1:1 by weight solvent mixture of toluene, methyl ethyl ketone and n-hexane and further carbon fibers having a fiber diameter of 7 $\mu$m and a fiber length of 60 $\mu$m were dispersed in the above dispersion in an amount of 10% by weight based on the solid content of the dispersion.

A silicone-coated releasing paper was coated with the above prepared carbon fiber-containing dispersion by the technique of screen printing by use of a screen mask of 150 mesh opening and dried by heating in an oven at 100° C. for 15 minutes. The dried rubber layer could readily be peeled off the releasing paper and had a thickness of about 30 $\mu$m. Microscopic examination of this rubber film indicated that the carbon fibers therein are oriented within the plane parallel to the surface of the rubber film but the fibers were oriented at random within the plane.

A piece of the thus prepared rubber film was sandwiched between two polyester-based flexible circuit boards each provided with stripe-patterned contacting terminals having a pitch of 1.2 mm as formed by printing with a carbon-filled electroconductive paint and pressed for 10 seconds at 150° C. under a pressure of 10 kg/cm$_2$ followed by cooling while being kept under the pressure. The circuit resistance between the opposite terminals on the thus adhesively bonded circuit boards was about 2 k.ohm on an average while the insulating resistance between the terminals on the same circuit board was at least 20 M.ohm.

What is claimed is:

1. An anisotropically electroconductive film adhesive structure which comprises (a) a film-like body of a thermally adhesive insulative material as a matrix and (b) electroconductive fibrils disposed in said matrix each having a length of 300 $\mu$m or smaller with an aspect ratio of at least 3 and dispersed in the film-like body of said insulative material oriented within a plane substantially parallel to the surface of the film-like insulative mterial, the diameter of the fibrils being equal to or smaller than a half of the thickness of the film-like insulative material and the volume ratio of the fibrils to the film-like body of the matrix being in the range from 2 to 20%.

2. The anisotropically electroconductive film adhesive structure as claimed in claim 1 wherein the electroconductive fibrils are unidirectionally oriented in the matrix of the thermally adhesive insulative material in the film-like form.

3. The anisotropically electroconductive film adhesive structure as claimed in claim 1 wherein the electroconductive fibrils are oriented at random each within a plane substantially parallel to the surface of the film adhesive structure.

4. The anisotropically electroconductive film adhesive structure as claimed in claim 1 having a laminar structure formed of a plurality of layers in each of which the electroconductive fibrils are unidirectionally oriented each within a plane substantially parallel to the surface of the film adhesive structure and the running direction of the electroconductive fibrils in one of the layers makes an angle of at least 30° with the running direction of the electroconductive fibrils in the neighboring layer.

5. The anisotropically electroconductive film adhesive structure as claimed in claim 1 wherein the thermally adhesive insulative material is thermoplastic.

6. The anisotropically electroconductive film adhesive structure as claimed in claim 1 wherein the thermally adhesive insulative material is thermosetting.

7. The anisotropically electroconductive film adhesive structure as claimed in claim 1 having a thickness of 200 $\mu$m or smaller.

8. An anisotropically electroconductive film adhesive structure comprising a film-like body of the thermally adhesive insulative material defining a matrix and conductive fibrils disposed in said matrix so that they are oriented substantially parallel to the surface of said film-like body, said fibrils being made of carbon type fibers and having a length of 300 $\mu$m or smaller with a length to diameter ratio of at least 3, the smaller dimensions of said fibrils being equal to or smaller than about one-half the thickness of said film-like body, the volume ratio of said fibrils to said insulative material defining the matrix being in the range from about 2 to 20%, said insulative material being selected from the group consisting of polyamide resins, nylon resins, saturated polyester resins, butyral resins polymethyl methacrylate resins, polyurethane resins, polycarbonate resins, chloroprene rubbers, thermoplastic resins, chloroprene rubbers, thermoplastic styrene-butadiene rubbers and copolymers of ethylene.

* * * * *